(12) United States Patent
Sandhu et al.

(10) Patent No.: US 11,347,254 B2
(45) Date of Patent: May 31, 2022

(54) PROGRAMMABLE VOLTAGE REFERENCE

(71) Applicant: ARM Ltd., Cambridge (GB)

(72) Inventors: Bal S. Sandhu, Fremont, CA (US); George McNeil Lattimore, Austin, TX (US); Robert Campbell Aitken, San Jose, CA (US)

(73) Assignee: ARM, Ltd., Cambridge (GB)

( * ) Notice: Subject to any disclaimer, the term of this patent is extended or adjusted under 35 U.S.C. 154(b) by 0 days.

(21) Appl. No.: 15/828,189

(22) Filed: Nov. 30, 2017

(65) Prior Publication Data

US 2018/0081384 A1 Mar. 22, 2018

Related U.S. Application Data

(63) Continuation of application No. 14/826,064, filed on Aug. 13, 2015, now Pat. No. 9,851,738.

(51) Int. Cl.
| | |
|---|---|
| *G05F 1/10* | (2006.01) |
| *G05F 3/02* | (2006.01) |
| *G05F 3/08* | (2006.01) |
| *G11C 5/14* | (2006.01) |
| *G11C 7/14* | (2006.01) |
| *G11C 13/00* | (2006.01) |

(52) U.S. Cl.
CPC ............. *G05F 3/08* (2013.01); *G11C 5/147* (2013.01); *G11C 7/14* (2013.01); *G11C 13/0002* (2013.01)

(58) Field of Classification Search
CPC . G05F 3/262; G05F 3/265; G05F 3/30; G05F 3/205; G11C 5/147
USPC .................................................. 327/538–543
See application file for complete search history.

(56) References Cited

U.S. PATENT DOCUMENTS

| | | |
|---|---|---|
| 7,002,832 B2 | 2/2006 | Wuidart |
| 7,298,640 B2 | 11/2007 | Chen et al. |
| 7,639,523 B2 | 12/2009 | Celinska et al. |
| 7,778,063 B2 | 8/2010 | Brubaker et al. |
| 7,796,417 B1 | 9/2010 | Lewis |
| 7,872,900 B2 | 1/2011 | Paz de Araujo et al. |
| 8,536,899 B1 | 9/2013 | Lu et al. |
| 8,773,887 B1 | 7/2014 | Naji |
| 9,392,661 B2 | 7/2016 | Schiappelli |
| 9,748,943 B2 | 8/2017 | Sandhu |
| 2004/0227166 A1 | 11/2004 | Portmann |
| 2005/0110476 A1 | 5/2005 | Mukherjee et al. |
| 2005/0281073 A1 | 12/2005 | Cho |
| 2006/0033525 A1 | 2/2006 | Mair |

(Continued)

FOREIGN PATENT DOCUMENTS

| | | |
|---|---|---|
| CN | 101911205 A | 12/2010 |
| CN | 102197434 A | 9/2011 |

(Continued)

OTHER PUBLICATIONS

Celinska, Jolant et al., "Material and process optimization of correlated electron random access memories", Journal of Applied Physics, American Institute of physics, US, vol. 109, No. 9, May 13, 2011, 7 pages.

(Continued)

*Primary Examiner* — Quan Tra
(74) *Attorney, Agent, or Firm* — Berkeley Law & Technology Group, LLP

(57) ABSTRACT

Subject matter disclosed herein may relate to generation of programmable voltage references.

19 Claims, 6 Drawing Sheets

(56) References Cited

U.S. PATENT DOCUMENTS

| | | | |
|---|---|---|---|
| 2006/0181916 A1* | 8/2006 | Roehr | G11C 17/16 365/148 |
| 2007/0047961 A1 | 3/2007 | Inoue | |
| 2007/0262795 A1 | 11/2007 | Apsel | |
| 2008/0106925 A1 | 5/2008 | Paz de Araujo et al. | |
| 2008/0106926 A1 | 5/2008 | Brubaker | |
| 2008/0107801 A1 | 5/2008 | Celinska et al. | |
| 2008/0316803 A1 | 12/2008 | Lin et al. | |
| 2009/0315525 A1 | 12/2009 | Nascimento | |
| 2011/0075473 A1 | 3/2011 | Park | |
| 2011/0103140 A1* | 5/2011 | Chung | G11C 13/004 365/163 |
| 2011/0122684 A1 | 5/2011 | Sheu et al. | |
| 2011/0128773 A1 | 6/2011 | Azuma | |
| 2012/0051127 A1* | 3/2012 | Yoon | G11C 13/004 365/163 |
| 2013/0285699 A1 | 10/2013 | McWilliams et al. | |
| 2013/0294136 A1 | 11/2013 | Siau | |
| 2014/0063897 A1 | 3/2014 | Guo | |
| 2014/0078811 A1 | 3/2014 | Kawai et al. | |
| 2014/0269003 A1 | 9/2014 | Guillemenet | |
| 2015/0325624 A1 | 11/2015 | Roizin | |
| 2016/0163978 A1* | 6/2016 | Paz de Araujo | H01L 45/1608 257/4 |
| 2017/0045905 A1 | 1/2017 | Sandhu | |
| 2017/0047919 A1 | 2/2017 | Sandhu | |

FOREIGN PATENT DOCUMENTS

| | | |
|---|---|---|
| CN | 108140403 A | 6/2018 |
| GB | 2556286 B | 10/2020 |
| KR | 20180061160 A | 6/2018 |
| TW | 201725466 A | 7/2017 |
| WO | 2008/058264 A2 | 5/2008 |
| WO | 2013/148357 A1 | 10/2013 |
| WO | 2014/020478 A2 | 2/2014 |
| WO | 2015/125473 A1 | 8/2015 |

OTHER PUBLICATIONS

U.S. Appl. No. 14/826,091, filed Aug. 13, 2015, 67 pages.
U.S. Appl. No. 14/826,091, filed Aug. 27, 2015, 3 pages.
U.S. Appl. No. 14/826,091: Request for Corrected Filing Receipt, dated Sep. 15, 2015, 9 pages
U.S. Appl. No. 14/826,091: Request for Corrected Filing Receipt, dated Sep. 29, 2015, 14 pages.
U.S. Appl. No. 14/826,091: Filing Receipt, Oct. 2, 2015, 3 pages.
U.S. Appl. No. 14/826,091: Non-Final Rejection, dated Nov. 22, 2016, 10 pages.
U.S. Appl. No. 14/826,091: Amendment/Req. Reconsideration-After Non-Final Reject, dated Feb. 15, 2017, 15 pages.
U.S. Appl. No. 14/826,091: Notice of Publication, dated Feb. 16, 2017, 1 page.
U.S. Appl. No. 14/826,091: Notice of Allowance and Fees Due, dated Apr. 19, 2017, 9 pages.
U.S. Appl. No. 14/826,091: Issue Fee Payment, Jul. 18, 2017, 1 page.
U.S. Appl. No. 14/826,091: Issue Notification, dated Aug. 9, 2017, 1 page.
U.S. Appl. No. 15/659,534, filed Jul. 25, 2017, 72 pages.
U.S. Appl. No. 15/659,534: Filing Receipt, Aug. 15, 2017, 3 pages.
U.S. Appl. No. 15/659,534: Preliminary Amendment, dated Aug. 18, 2017, 10 pages.
U.S. Appl. No. 15/659,534: Notice to File Missing Parts, dated Aug. 15, 2017, 2 pages.
U.S. Appl. No. 15/659,534: Notice of Incomplete Reply, dated Aug. 21, 2017, 2 pages.
U.S. Appl. No. 15/659,534: Filing Receipt, Oct. 18, 2017, 3 pages.
U.S. Appl. No. 15/659,534: Non-Final Rejection, dated Oct. 30, 2017, 13 pages.
U.S. Appl. No. 14/826,064, filed Aug. 13, 2015, 57 pages.
U.S. Appl. No. 14/826,064: Filing Receipt, Aug. 27, 2015, 3 pages.
U.S. Appl. No. 14/826,064: Request for Corrected Filing Receipt, dated Sep. 11, 2015, 9 pages.
U.S. Appl. No. 14/826,064: Filing Receipt, Sep. 18, 2015, 3 pages.
U.S. Appl. No. 14/826,064: Non-Final Rejection, dated Oct. 7, 2016, 8 pages.
U.S. Appl. No. 14/826,064: Amendment/Req. Reconsideration-After Non-Final Reject, dated Dec. 19, 2016, 15 pages.
U.S. Appl. No. 14/826,064: Final Rejection, dated Jan. 27, 2017, 1 page.
U.S. Appl. No. 14/826,064: Notice of Publication, dated Feb. 16, 2017, 1 page.
U.S. Appl. No. 14/826,064: Response After Final Action, dated Mar. 21, 2017, 18 pages.
U.S. App. 14/826,064: Advisory Action, dated Mar. 30, 2017, 2 pages
U.S. Appl. No. 14/826,064: After Final Consideration Program Decision, dated Mar. 30, 2017, 1 page.
U.S. Appl. No. 14/826,064: RCE and Amendments, dated Apr. 27, 2017, 19 pages.
U.S. Appl. No. 14/826,064: Notice of Allowance and Fees Due, dated Aug. 16, 2017, 5 pages.
U.S. Appl. No. 14/826,064: Issue Fee Payment, Nov. 16, 2017, 1 page.
U.S. Appl. No. 14/826,064: Issue Notification, dated Dec. 6, 2017, 1 page.
U.S. Appl. No. 14/875,357, filed Oct. 5, 2015, 27 pages.
U.S. Appl. No. 14/875,357: Filing Receipt, Oct. 20, 2015, 3 pages.
U.S. Appl. No. 14/875,357: Non-Final Rejection, dated Oct. 21, 2016, 17 pages.
U.S. Appl. No. 14/875,357: Amendment/Req. Reconsideration-After Non-Final Reject, dated Jan. 17, 2017, 15 pages.
U.S. Appl. No. 14/875,357: Non-Final Rejection, dated Feb. 28, 2017, 14 pages.
U.S. Appl. No. 14/875,357: Notice of Publication, dated Apr. 6, 2017, 1 page.
U.S. Appl. No. 14/875,357: Non-Final Rejection, dated Jun. 22, 2017, 14 pages.
U.S. Appl. No. 14/875,357: Amendment/Req. Reconsideration-After Non-Final Reject, dated Sep. 29, 2017, 15 pages.
U.S. Appl. No. 14/875,357: Final Rejection, dated Oct. 25, 2017, 15 pages.
PCT/GB2016/052516, Application as filed Aug. 12, 2016, 42 pages.
PCT/GB2016/052516, International Search Report and Written Opinion, dated Nov. 16, 2016, 16 pages.
PCT/GB2016/052517, International Search Report and Written Opinion, dated Nov. 14, 2016, 11 pages.
PCT/GB2016/053082, Application as filed Oct. 4, 2016, 21 pages.
PCT/GB2016/053082, International Search Report and Written Opinion, dated Dec. 20, 2016, 14 pages.
Examination Report under Section 18(3), International Application No. GB1802329.1, dated Dec. 12, 2019, 4 pgs.
Response to Examination Report under Section 18(3), International Application No. GB1802329.1, filed Feb. 11, 2020, 17 pgs.
Response to Notice to File Missing Parts and Incomplete Reply filed Oct. 16, 2017, U.S. Appl. No. 15/659,534, 9 pgs.
Response to Non-Final Office Action filed Jan. 30, 2018, U.S. Appl. No. 15/659,534, 17 pgs.
Final Office Action dated May 29, 2018, U.S. Appl. No. 15/659,534, 18 pgs.
Request for Continued Examination filed Oct. 29, 2018, U.S. Appl. No. 15/659,534, 20 pgs.
Non-Final Office Action dated Nov. 30, 2018, U.S. Appl. No. 15/659,534, 15 pgs.
Response to Non-Final Office Action filed Feb. 28, 2019, U.S. Appl. No. 15/659,534, 20 pgs.
Notice of Allowance dated Jun. 4, 2019, U.S. Appl. No. 15/659,534, 8 pgs.
Issue Fee Payment filed Sep. 4, 2019, U.S. Appl. No. 15/659,534, 6 pgs.
Issue Notification dated Sep. 25, 2019, U.S. Appl. No. 15/659,534, 1 pg.
U.S. Appl. No. 16/600,366, filed Oct. 11, 2019, 82 pgs.

(56) References Cited

OTHER PUBLICATIONS

Filing Receipt mailed Oct. 29, 2019, U.S. Appl. No. 16/600,366, 4 pgs.
Non-Final Office Action dated Jan. 27, 2020, U.S. Appl. No. 16/600,366, 11 pgs.
Response to Non-Final Office Action filed Apr. 27, 2020, U.S. Appl. No. 16/600,366, 23 pgs.
Response to Non-Final Office Action filed Jun. 1, 2017, U.S. Appl. No. 14/875,357, 18 pgs.
Response to Final Office Action and AFCP Request filed Dec. 22, 2017, U.S. Appl. No. 14/875,357, 20 pgs.
Notice of Allowance dated Jan. 10, 2018, U.S. Appl. No. 14/875,357, 9 pgs.
Issue Fee Payment and Rule 312 Amendment filed Apr. 9, 2018, U.S. Appl. No. 14/875,357, 10 pgs.
Response to Rule 312 Amendment dated Apr. 13, 2018, U.S. Appl. No. 14/875,357, 2 pgs.
Issue Notification dated May 2, 2018, U.S. Appl. No. 14/875,357, 1 pg.
U.S. Appl. No. 15/960,034, filed Apr. 23, 2018, 43 pgs.
Filing Receipt mailed May 16, 2018, U.S. Appl. No. 15/960,034, 1 pg.
Request for Corrected Filing Receipt filed Aug. 22, 2018, U.S. Appl. No. 15/960,034, 9 pgs.
Notice of Allowance dated Mar. 5, 2019, U.S. Appl. No. 15/960,034, 12 pgs.
Issue Fee Payment filed May 31, 2019, U.S. Appl. No. 15/960,034, 3 pgs.
Exam Report dated Mar. 27, 2020, Patent Application No. GB1802329. 1, 2 pgs.
Response to Exam Report filed May 27, 2020, Patent Application No. GB1802329.1, 15 pgs.
Search Report for Patent Application No. 105125707 dated Dec. 13, 2019, 37 pgs.
Notice of Allowance dated May 18, 2020, Patent Application No. 105125707, 4 pgs.
Filing Receipt dated Apr. 26, 2018 in CN Application No. 2018042300739090, 2 pages.
Request for Examination filed Aug. 9, 2018 in CN Application No. 2018042300739090, 2 pages.
Notification of Entering the Substantive Examination Phase dated Aug. 22, 2018 in CN Application No. 2018042300739090, 2 pages.
Office Action dated Jan. 22, 2021 in CN Application No. 2018042300739090, 17 pages.
Notification of Registration dated Jul. 28, 2021 in CN Application No. 2018042300739090, 2 pages.
Notice of the Granting of a Patent Right for an Invention dated Jul. 28, 2021 in CN Application No. 2018042300739090, 3 pages.
Electronic Filing Receipt dated Feb. 13, 2018 in GB Application No. 1802329.1, 2 pages.
Notice of Publication dated Apr. 23, 2018 in GB Application No. 1802329.1, 2 pages.
Examination Report dated Dec. 12, 2019 in GB Application No. 1802329.1, 4 pages.
Response to Examination Report filed Feb. 11, 2020 in GB Application No. 1802329.1, 16 pages.
Further Examination Report dated Mar. 27, 2020 in GB Application No. 1802329.1, 2 pages.
Response to Further Examination Report filed May 27, 2020 in GB Application No. 1802329.1, 12 pages.
Notification of Intent to Grant dated Jul. 29, 2020 in GB Application No. 1802329.1, 2 pages.
Notification of Grant dated Sep. 15, 2020 in GB Application No. 1802329.1, 2 pages.
Certificate of Grant of Patent dated Oct. 14, 2020 in GB Application No. 1802329.1, 1 page.
Request for Examination filed Aug. 9, 2021 in KR Application No. 10-2018-7007102, 2 pages.
KR Patent Application filed Mar. 12, 2018 in KR Application No. 10-2018-7007102, 51 pages.
Search Report dated Dec. 12, 2019 in TW Application No. 105125707, 1 page.
Notice of Allowance dated May 18, 2020 in TW Application No. 105125707, 4 pages.
Response to Office Action filed Mar. 12, 2020 in TW Application No. 105125707, 30 pages.
Patent Certificate dated Sep. 21, 2020 in TW Application No. 105125707, 10 pages.

* cited by examiner

PROGRAMMABLE VOLTAGE REFERENCE

This application is a continuation of U.S. patent application Ser. No. 14/826,064, titled PROGRAMMABLE VOLTAGE REFERENCE, filed Aug. 13, 2015, and is incorporated herein by reference in its entirety.

BACKGROUND

Field

Subject matter disclosed herein may relate to generation of programmable voltage references.

Information

Integrated circuit devices, such as electronic switching devices, for example, may be found in a wide range of electronic device types. For example, memory, logic, and/or other electronic devices may incorporate electronic switches that may be used in computers, digital cameras, cellular telephones, tablet devices, personal digital assistants, etc. Factors related to electronic switching devices, such as may be incorporated in memory, logic, and/or other electronic devices, that may be of interest to a designer in considering suitability for any particular application may include physical size, storage density, operating voltages, and/or power consumption, for example. Other example factors that may be of interest to designers may include cost of manufacture, ease of manufacture, scalability, and/or reliability. Also, there appears to be an ever increasing need for memory, logic, and/or other electronic devices that exhibit characteristics of lower power and/or higher speed.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Figure 1B:
FIG. 1b depicts an example symbol for a correlated electron switch.

Reference is made in the following detailed description to accompanying drawings, which form a part hereof, wherein like numerals may designate like parts throughout to indicate corresponding and/or analogous components. It will be appreciated that components illustrated in the figures have not necessarily been drawn to scale, such as for simplicity and/or clarity of illustration. For example, dimensions of some components may be exaggerated relative to other components. Further, it is to be understood that other embodiments may be utilized. Furthermore, structural and/or other changes may be made without departing from claimed subject matter. It should also be noted that directions and/or references, for example, such as up, down, top, bottom, and so on, may be used to facilitate discussion of drawings and/or are not intended to restrict application of claimed subject matter. Therefore, the following detailed description is not to be taken to limit claimed subject matter and/or equivalents.

DETAILED DESCRIPTION

References throughout this specification to one implementation, an implementation, one embodiment, an embodiment and/or the like means that a particular feature, structure, and/or characteristic described in connection with a particular implementation and/or embodiment is included in at least one implementation and/or embodiment of claimed subject matter. Thus, appearances of such phrases, for example, in various places throughout this specification are not necessarily intended to refer to the same implementation or to any one particular implementation described. Furthermore, it is to be understood that particular features, structures, and/or characteristics described are capable of being combined in various ways in one or more implementations and, therefore, are within intended claim scope, for example. In general, of course, these and other issues vary with context. Therefore, particular context of description and/or usage provides helpful guidance regarding inferences to be drawn.

As utilized herein, the terms "coupled", "connected," and/or similar terms are used generically. It should be understood that these terms are not intended as synonyms. Rather, "connected" is used generically to indicate that two or more components, for example, are in direct physical, including electrical, contact; while, "coupled" is used generically to mean that two or more components are potentially in direct physical, including electrical, contact; however, "coupled" is also used generically to also mean that two or more components are not necessarily in direct contact, but nonetheless are able to co-operate and/or interact. The term coupled is also understood generically to mean indirectly connected, for example, in an appropriate context.

The terms, "and", "or", "and/or" and/or similar terms, as used herein, include a variety of meanings that also are expected to depend at least in part upon the particular context in which such terms are used. Typically, "or" if used to associate a list, such as A, B or C, is intended to mean A, B, and C, here used in the inclusive sense, as well as A, B or C, here used in the exclusive sense. In addition, the term "one or more" and/or similar terms is used to describe any feature, structure, and/or characteristic in the singular and/or is also used to describe a plurality and/or some other combination of features, structures and/or characteristics. Likewise, the term "based on" and/or similar terms are understood as not necessarily intending to convey an exclusive set of factors, but to allow for existence of additional factors not necessarily expressly described. Of course, for all of the foregoing, particular context of description and/or usage provides helpful guidance regarding inferences to be drawn. It should be noted that the following description merely provides one or more illustrative examples and claimed subject matter is not limited to these one or more illustrative examples; however, again, particular context of description and/or usage provides helpful guidance regarding inferences to be drawn.

In a very wide range of electronic device types and/or electronic circuit types, accurate voltage reference signals may find important usage. For example, and not by way of limitation, a more accurate voltage reference signal may be an important building block in mixed-signal chips, including a wide range of device and/or circuit types such as data converters, phase-locked loop circuits, high-speed transceivers, etc. Embodiments disclosed herein may describe example apparatuses, techniques, and/or processes for generating voltage reference signals. In one or more embodiments, a voltage reference signal may be adjustable, such as to account for variations in temperature, process, and/or voltage, for example. In one or more embodiments, an example technique for adjusting a voltage reference signal may include the use of a variable impeder device, also referred to as a correlated electron switch device, as explained more fully below.

Particular aspects of the present disclosure incorporate correlated electron material (CEM) to form a correlated electron switch (CES), such as, for example, in memory and/or logic devices. CES devices may also be utilized in a wide range of other electronic circuit types, such as, for example, filter circuits, data converters, phase locked loop circuits, and high-speed transceivers, although the scope of claimed subject matter is not limited in scope in these respects. In this context, a CES may exhibit a substantially abrupt conductor/insulator transition arising from electron correlations rather than solid state structural phase changes (e.g., crystalline/amorphous in phase change memory (PCM) devices or filamentary formation and conduction in resistive RAM devices). In one aspect, a substantially abrupt conductor/insulator transition in a CES may be responsive to a quantum mechanical phenomenon, in contrast to melting/solidification or filament formation, for example. Such a quantum mechanical transition between conductive and insulative states, and/or between first and second impedance states, in a CES may be understood in any one of several aspects. As used herein, the terms "conductive state", "lower impedance state", and/or "metal state" may be interchangeable, and/or may at times be referred to as a "conductive/lower impedance state." Similarly, the terms "insulative state" and "higher impedance state" may be used interchangeably herein, and/or may at times be referred to as an "insulative/higher impedance state."

In an aspect, a quantum mechanical transition of correlated electron switch material between an insulative/higher impedance state and a conductive/lower impedance state may be understood in terms of a Mott transition. In a Mott transition, a material may switch from an insulative/higher impedance state to a conductive/lower impedance state if a Mott transition condition occurs. The Mott criteria is defined by $(n_C)1^{/3} a \approx 0.26$, where $n_C$ is a concentration of electrons and "a" is the Bohr radius. When a critical carrier concentration is achieved such that the Mott criteria is met, the Mott transition will occur and the state of the CES will change from a higher resistance/higher capacitance state (that is, an insulative/higher impedance state) to a lower resistance/lower capacitance state (that is, a conductive/lower impedance state).

In another aspect, the Mott transition is controlled by a localization of electrons. When carriers are localized, the strong coulomb interaction between the electrons splits the bands of the CEM to create an insulator. When electrons are no longer localized, the weak coulomb interaction dominates and the band splitting is removed, resulting in a metal (conductive) band. This is sometimes explained as a "crowded elevator" phenomenon. While an elevator has only a few people in it, the people can move around easily, which is analogous to a conductive/lower impedance state. While the elevator reaches a certain concentration of people, on the other hand, the people can no longer move, which is analogous to the insulative/higher impedance state. However, it should be understood that this classical explanation provided for illustrative purposes, like all classical explanations of quantum phenomenon, is only an incomplete analogy, and that claimed subject matter is not limited in this respect.

Further, in an embodiment, switching from an insulative/higher impedance state to a conductive/lower impedance state may bring about a change in capacitance in addition to a change in resistance. For example, a CES may include the property of variable resistance together with the property of variable capacitance. That is, impedance characteristics of a CES device may include both resistive and capacitive components. For example, in a metal state, a CEM may have substantially zero electric field, and therefore substantially zero capacitance. Similarly, in an insulative/higher impedance state (in which electron screening may be very imperfect due to lower density of free electrons), an external electric field may be capable of penetrating the CEM and therefore the CEM will have capacitance due to a physical change in the dielectric function of the CEM. Thus, for example, a transition from an insulative/higher impedance state to a conductive/lower impedance state in a CES may result in changes in both resistance and capacitance, in an aspect.

In an embodiment, a CES device may switch impedance states responsive to a Mott-transition in a majority of the volume of the CEM of a CES device. In an embodiment, a CES device may comprise a "bulk switch." As used herein, the term "bulk switch" refers to at least a majority volume of a CEM of a CES device switching impedance states, such as responsive to a Mott-transition. For example, in an embodiment, substantially all of a CEM of a CES device may switch from an insulative/higher impedance state to a conductive/lower impedance state or from a conductive/lower impedance state to an insulative/higher impedance state responsive to a Mott-transition. In an aspect, a CEM may comprise one or more transition metal oxides, one or more rare earth oxides, one or more oxides of one or more f-block elements of the periodic table, one or more rare earth transitional metal oxide perovskites, yttrium, and/or ytterbium, although claimed subject matter is not limited in scope in this respect. In an embodiment, a device, such as CES device, may comprise CEM including one or more materials selected from a group comprising aluminum, cadmium, chromium, cobalt, copper, gold, iron, manganese, mercury, molybdenum, nickel, palladium, rhenium, ruthenium, silver, tin, titanium, vanadium, and zinc (which may be linked to a cation such as oxygen or other types of ligands), or combinations thereof, although claimed subject matter is not limited in scope in this respect.

Figure 1A:
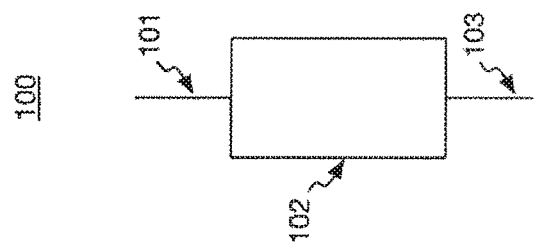
FIG. 1a shows block diagram of an example embodiment of a correlated electron switch device comprising a correlated electron material, in accordance with an embodiment.

FIG. 1a shows an example embodiment 100 of a CES device comprising CEM, such as material 102, sandwiched between conductive terminals, such as conductive terminals 101 and 103. In an embodiment, a CES device, such as CES device 100, may comprise a variable impeder device. As utilized herein, the terms "correlated electron switch" and "variable impeder" may be interchangeable. At least in part through application of a critical voltage and a critical current between the terminals, such as between conductive terminals 101 and 103, the CEM, such as material 102, may transition between the aforementioned conductive/lower impedance state and insulative/higher impedance state. As mentioned, CEM, such as material 102, in a variable impeder device, such as CES device 100, may transition between a first impedance state and a second impedance state due to a quantum mechanical transition of the correlated electron switch material as a result an applied critical voltage and an applied critical current, as described in more detail below. Also, as mentioned above, a variable impeder device, such as variable impeder device 100, may exhibit properties of both variable resistance and variable capacitance.

In a particular embodiment, a variable impeder device, such as CES device 100, may comprise a CEM that may transition between or among a plurality of detectable impedance states based, at least in part, on a transition of at least a majority portion of the CEM between an insulative/higher impedance state and a conductive/lower impedance state due to a quantum mechanical transition of the correlated electron switch material. For example, in an embodiment, a CES device may comprise a bulk switch, in that substantially all of a CEM of a CES device may switch from an insulative/higher impedance state to a conductive/lower impedance state or from a conductive/lower impedance state to an insulative/higher impedance state responsive to a Mott-transition. In this context, an "impedance state" means a detectable state of a variable impeder device that is indicative of a value, symbol, parameter and/or condition, just to provide a few examples. In one particular embodiment, as described below, an impedance state of a CES device may be detected based, at least in part, on a signal detected on terminals of the CES device in a read and/or sense operation. In another particular embodiment, as described below, a CES device may be placed in a particular impedance state to represent or store a particular value, symbol, and/or parameter, and/or to achieve a particular capacitance value for the CES device by application of one or more signals across terminals of the CES device in a "write" and/or "program" operation, for example. Of course, claimed subject matter is not limited in scope to the particular example embodiments described herein.

FIG. 1b depicts an example symbol 110 that may be utilized, for example, in electrical circuit schematic diagrams to notate a CES/variable impeder device. Example symbol 110 is meant to remind the viewer of the variable resistance and variable capacitance properties of a CES/variable impeder device, such as CES device 100. Example symbol 110 is not meant to represent an actual circuit diagram, but is merely meant as an electrical circuit diagram symbol. Of course, claimed subject matter is not limited in scope in these respects.

Figure 2:
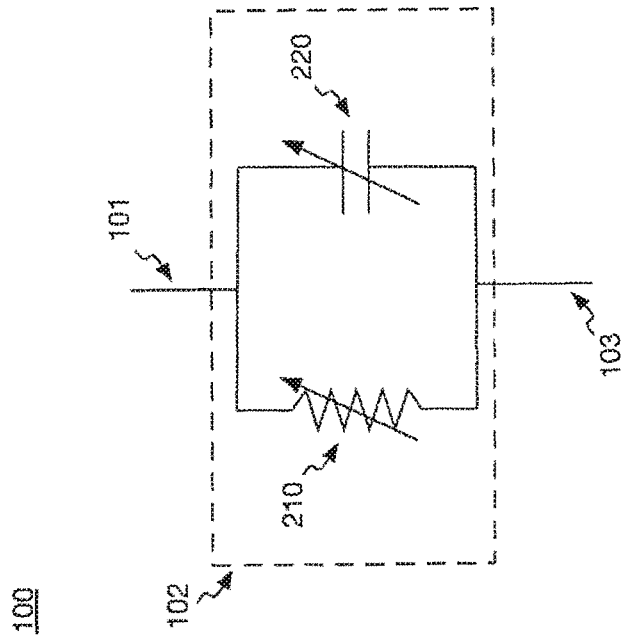
FIG. 2 depicts an example equivalent circuit for a correlated electron switch, according to an embodiment.

FIG. 2 depicts a schematic diagram of an equivalent circuit of an example CES/variable impeder device, such as CES device 100. As mentioned, a CES/variable impeder device may comprise characteristics of both variable resistance and variable capacitance. That is, the impedance characteristics for a CES/variable impeder device, such as CES device 100, may depend at least in part on the resistance and capacitance characteristics of the device. For example, an equivalent circuit for a variable impeder device may, in an embodiment, comprise a variable resistor, such as variable resistor 210 in parallel with a variable capacitor, such as variable capacitor 220. Of course, although a variable resistor 210 and variable capacitor 220 are depicted in FIG. 2 as comprising discrete components, a variable impeder device, such as CES 100, may comprise a substantially homogenous CEM, such as CEM 102, wherein the CEM comprises characteristics of variable capacitance and variable resistance.

Table 1 below depicts an example truth table for an example variable impeder device, such as CES device 100.

TABLE 1

Correlated Electron Switch Truth Table

| Resistance | Capacitance | Impedance |
| --- | --- | --- |
| $R_{high}(V_{applied})$ | $C_{high}(V_{applied})$ | $Z_{high}(V_{applied})$ |
| $R_{low}(V_{applied})$ | $C_{low}(V_{applied})\sim 0$ | $Z_{low}(V_{applied})$ |

In an embodiment, example truth table 120 shows that a resistance of a variable impeder device, such as CES device 100, may transition between a lower resistance state and a higher resistance state that is a function, at least in part, of a voltage applied across the CEM. In an embodiment, a resistance of a lower resistance state may be 10-100,000 times lower than a resistance of a higher resistance state, although claimed subject matter is not limited in scope in this respect. Similarly, example truth table 120 shows that a capacitance of a variable impeder device, such as CES device 100, may transition between a lower capacitance state, which for an example embodiment may comprise approximately zero, or very little, capacitance, and a higher capacitance state that is a function, at least in part, of a voltage applied across the CEM. Also, as seen in Table 1, a variable impeder device transition from a higher resistance/higher capacitance state to a lower resistance/lower capacitance state may be represented as a transition from a higher impedance state to a lower impedance state. Similarly, a transition from a lower resistance/lower capacitance state to a higher resistance/higher capacitance state may be represented as a transition from a lower impedance state to a higher impedance state.

It should be noted that a variable impeder, such as CES 100, is not a resistor, but rather comprises a device having properties of both variable capacitance and variable resistance. In an embodiment, resistance and/or capacitance values, and therefore impedance values, depend, at least in part, on an applied voltage.

Figure 3:
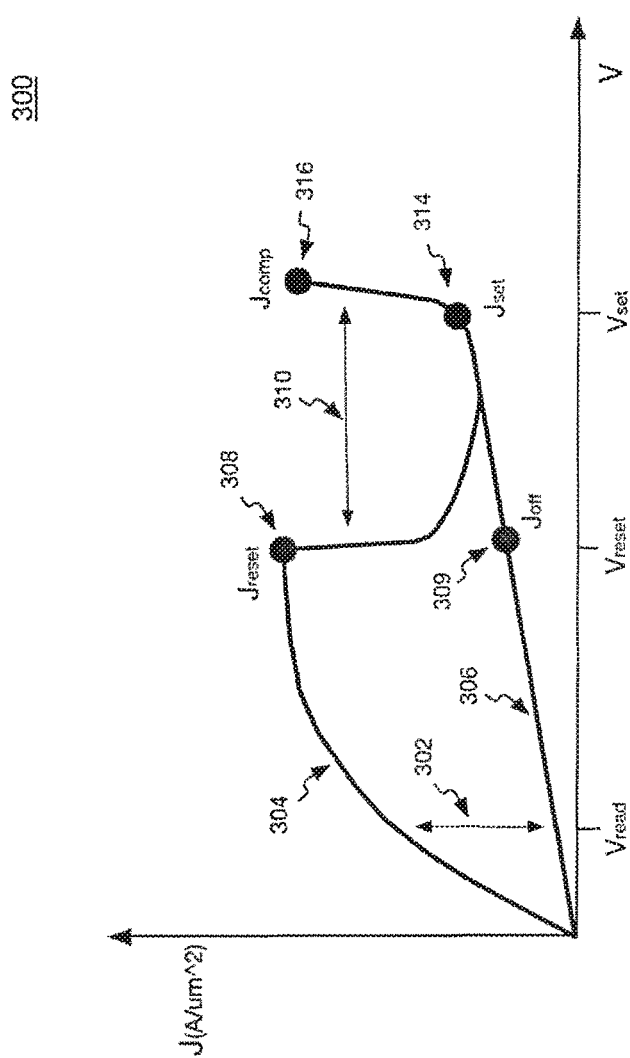
FIG. 3 shows an example plot of current density versus voltage for a correlated electron switch, according to an embodiment.

FIG. 3 shows a plot of current density versus voltage across electrically conductive terminals, such as electrically conductive terminals 101 and 103, for a CES device, such as example CES device 100, according to an embodiment. Based, at least in part, on a voltage applied to terminals of a variable impeder device (e.g., in a write operation), such as variable impeder device 100, a CEM, such as CEM 102, may be placed in a conductive/lower impedance state or an insulative/higher impedance state. For example, application of a voltage $V_{reset}$ and current density $J_{reset}$ may place the CES device in an insulative/higher impedance state, and application of a voltage $V_{set}$ and a current density $J_{set}$ may place the CES device in a conductive/lower impedance state. That is, a "set" condition may place a variable impeder device, such as CES device 100, into a conductive/lower impedance state, and a "reset" condition may place a variable impeder device, such as CES device 100, into an insulative/higher impedance state, in an embodiment. Following placement of the CES device in a lower impedance state or a higher impedance state, the particular state of the CES device may be detected at least in part by application of a voltage $V_{read}$ (e.g., in a read operation) and detection of a current or current density at terminals, such as electrically conductive terminals 101 and 103, of a variable impeder device, such as CES device 100.

In an embodiment, a CEM of a CES device may include, for example, any TMO, such as, for example, peroskovites, Mott insulators, charge exchange insulators, and/or Anderson disorder insulators. In a particular embodiment, a CES device may be formed from materials such as nickel oxide, cobalt oxide, iron oxide, yttrium oxide and peroskovites such as Cr doped strontium titanate, lanthanum titanate, and the manganite family including praesydium calcium manganite, and praesydium lanthanum manganite, to provide a few examples. In an embodiment, oxides incorporating elements with incomplete d and f orbital shells may exhibit sufficient impedance switching properties for use in a CES device. In an embodiment, a CES may be prepared without electroforming. Other embodiments may employ other transition metal compounds without deviating from claimed subject matter. For example, {M(chxn)$_2$Br}Br$_2$ where M may comprise Pt, Pd, or Ni, and chxn comprises 1 R,2R-cyclohexanediamine, and other such metal complexes may be used without deviating from the scope of claimed subject matter.

In one aspect, the CES device of FIG. 1 may comprise materials that comprise TMO metal oxide variable impedance materials, though it should be understood that these are exemplary only, and are not intended to limit the scope of claimed subject matter. Particular implementations may employ other variable impedance materials as well. Nickel oxide, NiO, is disclosed as one particular TMO. NiO materials discussed herein may be doped with extrinsic ligands, which may stabilize variable impedance properties by passivating the interfacing and allowing for adjustable voltages and impedances, in an embodiment. In a particular embodiment, NiO variable impedance materials disclosed herein may include a carbon containing ligand, which may be indicated by NiO(C$_x$). Here, one skilled in the art may determine a value of x for any specific carbon containing ligand and any specific combination of carbon containing ligand with NiO simply by balancing valences, in an embodiment. In another particular example embodiment, NiO doped with extrinsic ligands may be expressed as NiO(L$_x$), where L$_x$ is a ligand element or compound and x indicates a number of units of the ligand for one unit of NiO. One skilled in the art may determine a value of x for any specific ligand and any specific combination of ligand with NiO or any other transition metal simply by balancing valences, in an embodiment.

According to an embodiment, if sufficient bias is applied (e.g., exceeding a band-splitting potential) and the aforementioned Mott condition is met (injected electron holes=the electrons in the switching region), the CES device may rapidly switch from a conductive/lower impedance state to an insulator state via the Mott transition. This may occur at point 308 of the plot in FIG. 3. At this point, electrons are no longer screened and become localized. This correlation splits the bands to form an insulator. While the CEM of the CES device is still in the insulative/higher impedance state, current may generated by transportation of holes. If enough bias is applied across terminals of the CES device, electrons may be injected into a metal-insulator-metal (MIM) diode over the potential barrier of the MIM device. If enough electrons have been injected and enough potential is applied across terminals to achieve a set condition, an increase in electrons may screen electrons and remove a localization of electrons, which may collapse the band-splitting potential forming a metal, thereby placing the CES device in a conductive/lower impedance state.

According to an embodiment, current in a CEM of a CES device may be controlled by an externally applied "compliance" condition determined based, at least in part, on the external current limited during a write operation to achieve a set condition to place the CES device in a conductive/lower impedance state. This externally applied compliance current also sets the subsequent reset condition current density requirement. As shown in the particular implementation of FIG. 3, a current density $J_{comp}$ applied during a write operation at point 316 to place the CES device in a conductive/lower impedance state may determine a compliance condition for placing the CES in an insulative/higher impedance state in a subsequent write operation. As shown, the CEM of the CES device may be subsequently placed in an insulative/higher impedance state by application of a current density $J_{reset} \geq J_{comp}$ at a voltage $V_{reset}$ at point 308, wherein $J_{comp}$ may be externally applied, in an embodiment.

A compliance current, such as an externally applied compliance current, therefore may set a number of electrons in a CEM of a CES device which are to be "captured" by holes for the Mott transition. In other words, a current applied in a write operation to place a CES device in a conductive/lower impedance state may determine a number of holes to be injected to the CEM of the CES device for subsequently transitioning the CES device to an insulative/higher impedance state. As discussed more fully below, a compliance current may be applied dynamically.

As pointed out above, a transition to an insulative/higher impedance state may occur in response to a Mott transition at point 308. As pointed out above, such a Mott transition may occur at a condition in a CEM of a CES device in which a concentration of electrons n equals a concentration of electron holes p. This condition occurs when the following Mott criteria is met, as represented by expression (1) as follows:

$$\lambda_{TF} n^{\frac{1}{3}} = C \sim 0.26 \qquad (1)$$

$$n = \left(\frac{C}{\lambda_{TF}}\right)^3$$

where:

$\lambda_{TF}$ is a Thomas Fermi screening length; and

C is a constant which equals approximately 0.26 for the Mott transition.

According to an embodiment, a current or current density in a region 304 of the plot shown in FIG. 3 may exist in response to an injection of holes from a voltage signal applied across terminals, such as terminals 101 and 103, of a variable impeder device, such as CES device 100. Here, injection of holes may meet a Mott transition criterion for the conductive to insulator transition at current $I_{MI}$ as a critical voltage $V_{MI}$ is applied across terminals, such as terminal 101 and 103, of a variable impeder device, such as CES device 100. This may be modeled according to expression (2) as follows:

$$I_{MI}(V_{MI}) = \frac{dQ(V_{MI})}{dt} \approx \frac{Q(V_{MI})}{t} \qquad (2)$$

$$Q(V_{MI}) = qn(V_{MI})$$

Where $Q(V_{MI})$ is the charge injected (hole or electron) and is a function of the applied voltage. As used herein, the notation "MI" signifies a metal-to-insulator transition, and the notation "IM" signifies an insulator-metal transition. That is, "$V_{MI}$" refers to a critical voltage and "$I_{MI}$" refers to a critical current to transition a CEM from a conductive/lower impedance state to an insulative/higher impedance state. Similarly, "$V_{IM}$" refers to a critical voltage and "$I_{IM}$" refers to a critical current to transition a CEM from an insulative/higher impedance state to a conductive/lower impedance state.

Injection of holes to enable a Mott transition may occur between bands and in response to critical voltage $V_{MI}$ and critical current $I_{MI}$. By equating electron concentration n with the needed charge concentration to result in a Mott transition by holes injected by $I_{MI}$ in expression (2) according to expression (1), a dependency of such a critical voltage $V_{MI}$ on Thomas Fermi screening length $\lambda_{TF}$ may be modeled according to expression (3) as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \quad (3)$$

$$J_{reset}(V_{MI}) = J_{MI}(V_{MI}) = \frac{I_{MI}(V_{MI})}{A_{CEM}} = \frac{q}{A_{CEM}t}\left(\frac{C}{\lambda_{TF}(V_{MI})}\right)^3$$

Wherein $A_{CEM}$ is a cross-sectional area of a GEM, such as CEM 102, of a variable impeder device, such as CES device 100, and wherein $J_{reset}(V_{MI})$, depicted at point 308 of example plot 300, is a current density through the CEM, such as CEM 102, to be applied to the CEM at a critical voltage $V_{MI}$ to place the CEM of the CES device in an insulative/higher impedance state. In an embodiment, a CEM may be switched between a conductive/lower impedance state and an insulative/higher impedance state at least in part by a disproportionation reaction.

According to an embodiment, a CEM, such as CEM 102, of a variable impeder device, such as CES device 100, may be placed in a conductive/lower impedance state (e.g., by transitioning from an insulative/higher impedance state) by injection of a sufficient number of electrons to satisfy a Mott transition criteria.

In transitioning a CEM of a CES device to a conductive/lower impedance state, as enough electrons have been injected and the potential across terminals of the variable impeder device overcomes a critical switching potential (e.g., $V_{set}$), injected electrons begin to screen and unlocalize double-occupied electrons to reverse a disproportion reaction and closing the bandgap. A current density $J_{set}(V_{MI})$, depicted at point 314 of FIG. 3, for transitioning the CEM of the CES device to the conductive/lower impedance state in a metal-insulator Mott transition at a critical voltage $V_{MI}$ enabling transition to the conductive/lower impedance state may be represented according to expressions (4) as follows:

$$I_{MI}(V_{MI}) = \frac{dQ(V_{MI})}{dt} \approx \frac{Q(V_{MI})}{t} \quad (4)$$

$$Q(V_{MI}) = qn(V_{MI})$$

$$I_{MI}(V_{MI}) = \frac{Q(V_{MI})}{t} = \frac{qn(V_{MI})}{t} = \frac{q}{t}\left(\frac{C}{a_B}\right)^3$$

$$J_{set}(V_{IM}) = J_{injection}(V_{IM}) = J_{IM}(V_{IM}) = \frac{I_{IM}(V_{IM})}{A_{CEM}} = \frac{q}{A_{CEM}t}\left(\frac{C}{a_B}\right)^3$$

where:

$a_B$ is a Bohr radius.

According to an embodiment, a "read window" 302 for detecting a memory state of a CES device in a read operation may be set out as a difference between a portion 306 the plot of FIG. 3 while the CEM of the CES device is in an insulative/higher impedance state and a portion 304 of the plot FIG. 3 while the CEM of the CES device is in a conductive/lower impedance state at a read voltage $V_{read}$. In a particular implementation, read window 302 may be used to determine the Thomas Fermi screening length $\lambda_{TF}$ of a CEM, such as correlated electron switch material 102, of a variable impeder device, such as CES device 100. For example, at a voltage $V_{reset}$, current densities $J_{reset}$ and $J_{set}$ may be related to according to expression (5) as follows:

$$\lambda_{TF}(@V_{reset}) = a_B\left(\frac{J_{reset}}{J_{off}}\right)^{\frac{1}{3}} \quad (5)$$

wherein $J_{off}$ represents a current density of a CEM in an insulative/higher impedance state at $V_{reset}$. See, for example, point 309 of FIG. 3.

In another embodiment, a "write window" 310 for placing a CEM of CES device in an insulative/higher impedance or conductive/lower impedance state in a write operation may be set out as a difference between $V_{reset}$ and $V_{set}$. Establishing $|V_{set}|>|V_{reset}|$ may enable a switch between the conductive/lower impedance and insulative/higher impedance state. $V_{reset}$ may comprise approximately the band splitting potential caused by the correlation and $V_{set}$ may comprise approximately twice the band splitting potential, such that the read window may comprise approximately the band-splitting potential. In particular implementations, a size of write window 310 may be determined, at least in part, by materials and doping of the CEM of the CES device.

In an embodiment, a process for reading a value represented as an impedance state of a variable impeder device, such as CES device 100, may comprise a voltage being applied to a CEM of a CES device. At least one of a current and/or current density within a CEM of a CES device may be measured, and an impedance state of a CEM of a CES device may be determined, at least in part, on the measured current and/or current density, in an embodiment.

Additionally, in an embodiment, an impedance of an impedance state may depend at least in part on a combination of a capacitance and a resistance of a CEM of a CES device. In an embodiment, the determined impedance state may comprise one of a plurality of impedance states. A first impedance state may comprise a lower resistance and lower capacitance, and a second impedance state may comprise a higher resistance and a higher capacitance, for example. Also, in an embodiment, a ratio of the impedances of the plurality of impedance states may be proportional to a physical property of the CEM of the CES device. In an embodiment, the physical property of the CEM of the CES device may comprise at least one of a Thomas Fermi screening length and a Bohr radius. Further, in an embodiment, individual impedance states of the plurality of impedance states may be associated with a data value. Additionally, in an embodiment, a difference in current between a first impedance state and a second impedance state at a predetermined voltage provides an indication of a read window. However, claimed subject matter is not limited in scope in these respects.

In an embodiment, a plurality of electrons may be provided to a CEM of a CES device such that the CES enters a first impedance state. A plurality of holes may be provided to the CEM such that the CES enters a second impedance state. Also, in an embodiment, the plurality of electrons may cause a voltage across the CES to be greater than a set voltage threshold, and the plurality of holes may cause the voltage across the CES to be equal to or greater than a reset voltage threshold. Further, in an embodiment, a voltage across the CEM may cause a current density in the CEM to be equal to or greater than a set current density and/or a set current, and a voltage across the CEM may cause a current density in the CEM to be equal to or greater than a reset current density and/or a reset current.

Also, in an embodiment, a set voltage across the CEM and a set current density through a CEM of a CES device may be exceeded. Additionally, a reset voltage across a CEM and a reset current density through a CEM of a CES device may be exceeded. Further, in an embodiment, individual impedance states of a plurality of impedance states may be associated with a data value.

In an embodiment, at least one of a reset voltage, a set voltage, and a difference between the set voltage and the reset voltage are proportional to a physical property of a CEM of a CES device. A physical property of a CEM may include at least one of a strong electron potential due to localization, and/or a correlation of electrons, for example. Also, in an embodiment, a difference in the set voltage and the reset voltage may provide an indication of a size of at least one of a write/program window.

As mentioned previously, accurate voltage reference signals may find important usage in a very wide range of electronic device types and/or electronic circuit types. For example, and not by way of limitation, a more accurate voltage reference signal may be an important building block in mixed-signal chips, including a wide range of device and/or circuit types such as data converters, phase-locked loop circuits, and/or high-speed transceivers, to name but a few examples. Embodiments disclosed herein may describe apparatuses, techniques, and/or processes for generating voltage reference signals. In one or more embodiments, a voltage reference signal may be adjustable, such as to account for variations in temperature, process, and/or voltage, for example. Also, in one or more embodiments, an example technique for adjusting a voltage reference signal may include the use of a variable impeder device, such as CES 100, as explained more fully below.

Figure 4:
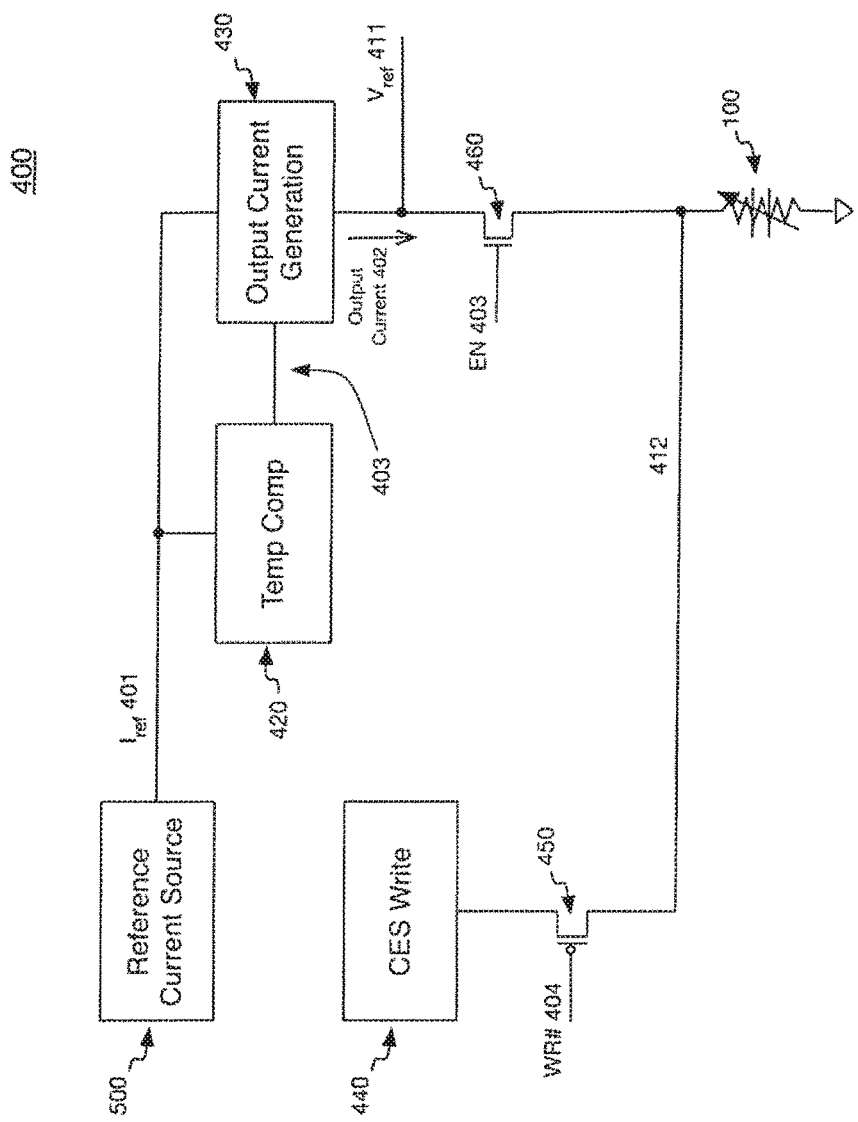
FIG. 4 depicts a schematic block diagram of an example circuit for generating a voltage reference signal, in accordance with an embodiment.

FIG. 4 depicts a schematic block diagram of an embodiment 400 of a circuit for generating a voltage reference signal, such as $V_{ref}$ 411, in accordance with an embodiment. In an embodiment, a reference current source, such as reference current source 500, may generate a reference current, such as $I_{ref}$ 401. An output current generation circuit, such as output current generation unit 430, may generate an output current, such as output current 402, based at least in part on a reference current, such as $I_{ref}$ 401. Additionally, a temperature compensation circuit, such as temperature compensation unit 420, may generate a temperature compensation current, such as temperature compensation current 403, to an output current generation circuit, such as output current generation unit 430. In an embodiment, an output current generation circuit, such as output current generation unit 430, may combine a reference current, such as $I_{ref}$ 401, with a temperature compensation current, such as temperature compensation current 403, to generate an output current, such as output current 402. In an embodiment, a temperature compensation current, such as temperature compensation current 403, may either add to or subtract from a reference current, such as $I_{ref}$ 401, and therefore an output current, such as output current 402, may be increased or decreased at least in part due to temperature compensation.

In an embodiment, an output current, such as output current 402, may be allowed to flow through a conductive element, such as transistor 460, at least in part in response to an assertion of an enable signal, such as EN 403. In an embodiment, transistor 460 may comprise an NMOS transistor. An output current, such as output current 402, may flow through a variable impeder device, such as CES 100. Also, in an embodiment, a voltage reference signal, such as $V_{ref}$ 411, may be generated at least in part as a result of an output current, such as output current 402, flowing through a variable impeder device, such as CES 100. For example, a voltage level for $V_{ref}$ 411 may approximately equal a voltage drop across CES 100 plus a voltage drop across transistor 460, in an embodiment.

Therefore, a voltage level of $V_{ref}$ 411 may depend, at least in part, on the impedance characteristics of CES 100. As previously mentioned, a variable impeder device, such as CES 100, may operate in one of a plurality of impedance states, and may be programmed accordingly. In an embodiment, a voltage level of $V_{ref}$ 411 may be adjusted by transitioning CES 100 from a one impedance state to another impedance state. For example, to increase the voltage level of $V_{ref}$ 411, CES 100 may be programmed to transition from a lower impedance state to a higher impedance state. A higher impedance in CES 100 may result in a greater voltage drop across CES 100, and therefore result in a greater voltage on node 412 and at $V_{ref}$ 411. Similarly, to decrease the voltage level of $V_{ref}$ 411, CES 100 may be programmed to transition from a higher impedance state to a lower impedance state. A lower impedance in CES 100 may result in a reduced voltage drop across CES 100, and therefore result in a reduced voltage on node 412 and at $V_{ref}$ 411.

To program a variable impeder device, such as CES 100, write circuitry, such as CES write unit 440, may apply a selectable voltage to a variable impeder device, such as CES 100, to transition from a first impedance state to a second impedance state. For example, to transition CES 100 from a higher impedance state to a lower impedance state, a voltage sufficient to achieve a set condition may be applied to CES 100. Additionally, to transition CES 100 from a lower impedance state to a higher impedance state, a voltage sufficient to achieve a reset condition may be applied to CES 100. Further, to perform a variable impeder device write operation, a write enable signal, such as WR#404, may be asserted to enable a conductive element, such as transistor 450. In an embodiment, transistor 450 may comprise a PMOS transistor. Also, to perform a variable impeder device write operation, an enable signal, such as EN 403, may be deasserted to disable a conductive element, such as transistor 460. Thus, to perform a variable impeder write operation, WR#404 may be asserted and EN 403 may be deasserted, in an embodiment.

In an embodiment, a voltage reference signal, such as $V_{ref}$ 411, may be adjusted in several different ways. For example, as discussed above, a variable impeder device, such as CES 100, may be programmed to enter different impedance states. Additionally, in an embodiment, $V_{ref}$ 411 may be adjusted according to a temperature compensation current generated by a temperature compensation circuit, such as temperature compensation unit 420. Further, in an embodiment, $V_{ref}$ 411 may be adjusted by adjusting a reference current, such as $I_{ref}$ 401. For example, in an embodiment, a reference current source, such as reference current source 500, may comprise a programmable current source.

Figure 5:
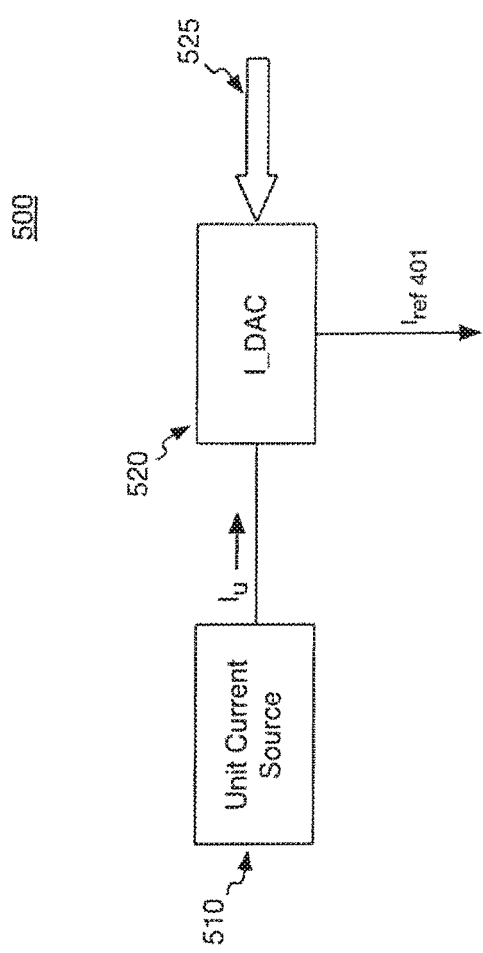
FIG. 5 depicts a schematic diagram of an example current source, in accordance with an embodiment.

FIG. 5 depicts a schematic block diagram of an example embodiment 500 of a circuit for generating a reference current, in accordance with an embodiment. To produce different levels of current, example circuit 500 for generating a programmable reference current may comprise an example current source, such as unit current source 510, coupled to an example programmable current source, such as digital-to-analog converter current source (I_DAC) 520. In an embodiment, unit current source 510 may provide an amount of current, such as a "unit" amount, to a programmable current source, such as I_DAC 520. Also, in an embodiment, a programmable current source, such as I_DAC 520, may provide multiples of a unit current, such as provided by unit current source 510, for example, to generate a reference current, such as $I_{ref}$ 401.

As depicted in FIG. 5, a digital code 525 may be provided to a programmable current source, such as I_DAC 520, in an embodiment. For example, a programmable current device, such as I_DAC 520, may generate various levels of current in accordance with a digital code, such as digital code 525. Reference current levels may be adjusted if desirable, such as to compensate for variations in process, voltage, and/or temperature, for example, by adjusting the digital code, in an embodiment. In this manner, a programmable current source, such as I_DAC 520, may be programmed and/or adjusted to generate different levels of current for $I_{ref}$ 401. Of course, claimed subject matter is not limited in scope to the specific examples for generating reference currents described herein.

Figure 6:
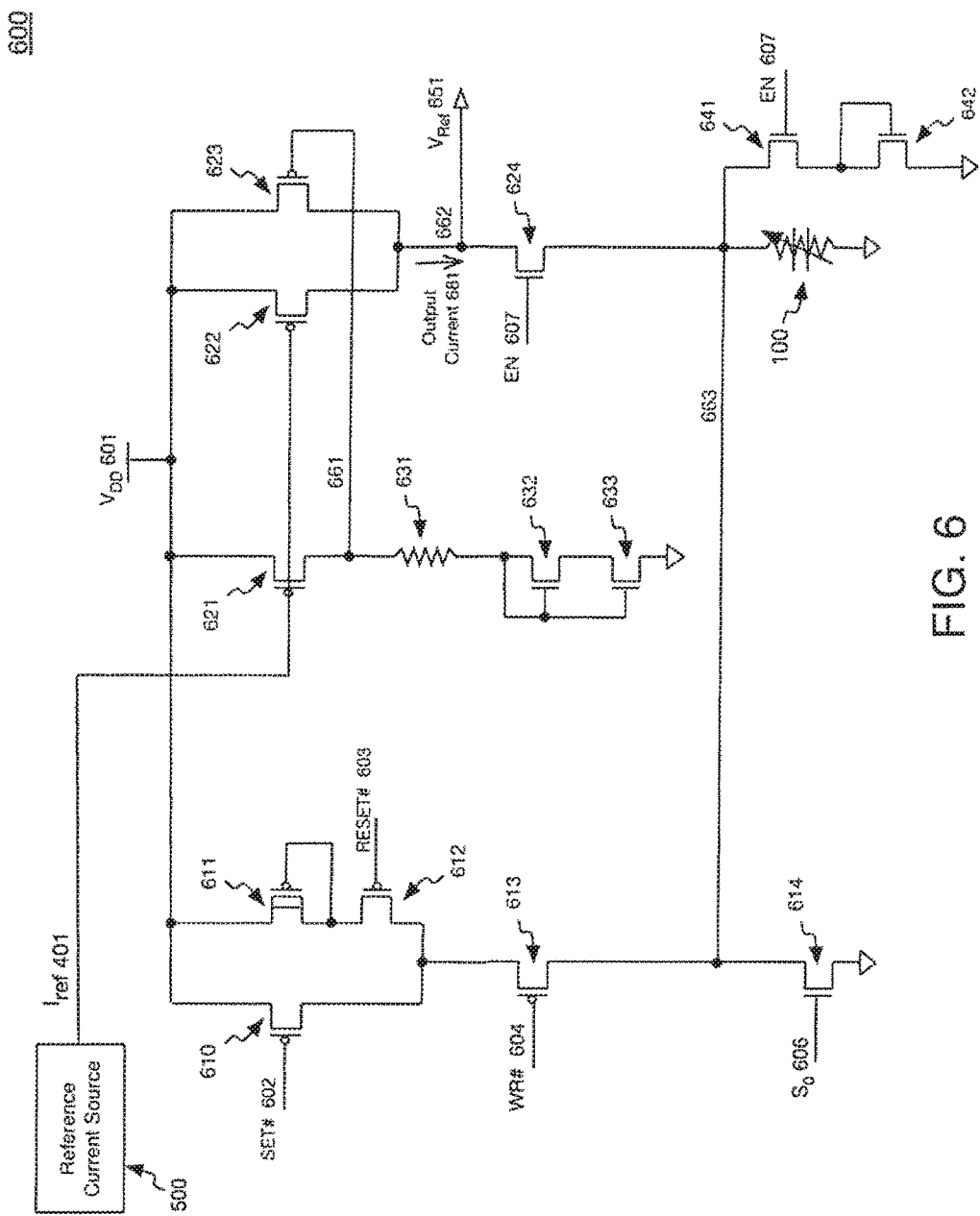
FIG. 6 depicts a schematic diagram of an example circuit for generating a voltage reference signal, in accordance with an embodiment.

FIG. 6 depicts a schematic diagram of an embodiment 600 of an example circuit for generating a voltage reference signal, such as $V_{ref}$ 651, in accordance with an embodiment. In an embodiment, a reference current source, such as reference current source 500, may generate a reference current, such as $I_{ref}$ 401. An output current generation circuit, such as including a current mirror circuit comprising conductive elements 621, 622, and 623, may generate an output current, such as output current 681, based at least in part on a reference current, such as $I_{ref}$ 401. In an embodiment, conductive elements 621, 622, and 623 may comprise PMOS transistors, for example. Additionally, a temperature compensation circuit, such as comprising resistor 631 and conductive elements 632 and 633, may generate a temperature compensation current at node 661 that may adjust a level of output current 681, in an embodiment. In an embodiment, conductive elements 632 and 633 may comprise NMOS transistors, for example. Also, in an embodiment, conductive elements 622 and 623 may combine a reference current, such as $I_{ref}$ 401, with a temperature compensation current, such applied to conductive element 623 by way of node 661, to generate an output current, such as output current 681. In an embodiment, a temperature compensation current, such as applied to conductive element 623 via node 661, may either add to or subtract from a reference current, such as $I_{ref}$ 401. Therefore, an output current, such as output current 681, may be increased or decreased at least in part due to temperature compensation, in an embodiment.

In an embodiment, resistor 631 may comprise an n-well resistor, although claimed subject matter is not limited in scope in this respect. Resistors utilized in temperature compensation circuits may be designed and/or selected depending on a desired temperature coefficient, for example. In one or more embodiments, an n-well resistor may have a characteristic of a positive temperature coefficient, for example. In another embodiment, resistor 631 may comprise a higher-resistance polysilicon resistor having a negative temperature coefficient, for example. Again, claimed subject matter is not limited in scope in these respects.

In an embodiment, an output current, such as output current 681, may be allowed to flow through a conductive element, such as transistor 624, at least in part in response to an assertion of an enable signal, such as EN 607. In an embodiment, transistor 624 may comprise an NMOS transistor. An output current, such as output current 681, may flow through a variable impeder device, such as CES 100. Also, in an embodiment, a voltage reference signal, such as $V_{ref}$ 651, may be generated at least in part as a result of an output current, such as output current 681, flowing through a variable impeder device, such as CES 100. For example, a voltage level for $V_{ref}$ 651 may approximately equal a voltage drop across CES 100 plus a voltage drop across transistor 624, in an embodiment.

Therefore, a voltage level of $V_{ref}$ 651 may depend, at least in part, on the impedance characteristics of CES 100. As previously mentioned, a variable impeder device, such as CES 100, may operate in one of a plurality of impedance states, and may be programmed accordingly. In an embodiment, a voltage level of $V_{ref}$ 651 may be adjusted by transitioning CES 100 from a one impedance state to another impedance state. For example, to increase the voltage level of $V_{ref}$ 651, CES 100 may be programmed to transition from a lower impedance state to a higher impedance state. A higher impedance in CES 100 may result in a greater voltage drop across CES 100, and therefore result in a greater voltage on node 663 and at $V_{ref}$ 651. Similarly, to decrease the voltage level of $V_{ref}$ 651, CES 100 may be programmed to transition from a higher impedance state to a lower impedance state. A lower impedance in CES 100 may result in a reduced voltage drop across CES 100, and therefore result in a reduced voltage on node 663 and at $V_{ref}$ 651.

To program a variable impeder device, such as CES 100, write circuitry, such as including conductive elements 610, 611, and 612, may apply a selectable voltage to a variable impeder device, such as CES 100, to transition from a first impedance state to a second impedance state. For example, to transition CES 100 from a higher impedance state to a lower impedance state, a voltage sufficient to achieve a set condition may be applied to CES 100. To perform a write operation to achieve a set condition in a variable impeder device, such as CES 100, a set signal, such as Set#602, may be asserted to enable conductive element 610, and WR# may be asserted to enable conductive element 613, thereby coupling a supply voltage, such as VDD 601 to CES 100 by way of node 663. In an embodiment, conductive elements 610, 611, 612, and 613 may comprise PMOS transistors, for example.

Additionally, to transition CES 100 from a lower impedance state to a higher impedance state, a voltage sufficient to achieve a reset condition may be applied to CES 100. To perform a write operation to achieve a reset condition in a variable impeder device, such as CES 100, a reset signal, such as Reset#603, may be asserted to enable conductive element 612, and WR# may be asserted to enable conductive element 613. In an embodiment, a voltage coupled to node 663 through conductive element 613 may have a voltage level approximately equal to a supply voltage, such as $V_{DD}$ 601, minus a voltage drop across conductive element 611. In an embodiment, conductive element 611 may comprise a thick-oxide PMOS transistor. Also, to perform a variable impeder device write operation, such as to transition CES device 100 from one impedance state to another impedance state, an enable signal, such as EN 607, may be deasserted to disable a conductive element, such as transistor 624, and to disable another conductive element, such as transistor 641. Thus, to perform a variable impeder write operation, WR#604 may be asserted and EN 607 may be deasserted, and one of conductive elements 610 or 612 may be enabled, depending on whether a set condition or a reset condition is specified, in an embodiment. For read operations, WR#604 may not be asserted and EN 607 may be asserted. As used herein, the term "read operation" refers to an output of a valid $V_{ref}$ 651 signal, such as may be utilized by one or more electronic circuits as a reference voltage signal, for example.

In an embodiment, $V_{DD}$ 601 may have a voltage level of approximately 1.2V. A voltage drop across thick-oxide PMOS transistor 611 may be approximately 0.55V, for example. Of course, claimed subject matter is not limited in scope in these respects. Also, in an embodiment, a voltage reference signal, such as $V_{ref}$ 651, may be adjusted in any of several different ways. For example, as discussed above, a variable impeder device, such as CES 100, may be programmed to enter different impedance states. Additionally, in an embodiment, $V_{ref}$ 651 may be adjusted according to a temperature compensation current generated by temperature compensation circuitry, as described above. Further, in an embodiment, $V_{ref}$ 651 may be adjusted by adjusting a reference current, such as $I_{ref}$ 401, as also described above. In an embodiment, a voltage reference signal, such as $V_{ref}$ 651, may be adjusted within a range of approximately 0.1V and 0.8V, although claimed subject matter is not limited in scope in this respect.

In an embodiment, a variable impeder device, such as CES 100, may be programmed to an initial state at least in part by pulsing a select signal $S_0$ to temporarily enable conductive element 614. In an embodiment, conductive element may comprise an NMOS transistor, for example. Such functionality may be optional, in an embodiment. Of course, claimed subject matter is not limited in scope to any of the specific example embodiments described herein.

Additionally, in an embodiment, an assertion of an enable signal, such as EN 607, may enable a conductive element, such as transistor 641, to couple a conductive element, such as diode-connected transistor 642 to node 663. By enabling transistor 641, node 663 may be clamped to a voltage generated by conductive element 642, in an embodiment. In an embodiment, for a read operation, node 663 may be clamped to a voltage level of approximately 0.5V, although claimed subject matter is not limited in this respect. In an embodiment, by clamping a voltage at node 663 to a voltage lower than a voltage needed for a set or reset operation, CES device 100 may be prevented from changing impedance state during read operations.

Although embodiments described herein utilize a single variable impeder device, such as CES 100, other embodiments may incorporate any number of variable impeder devices, coupled either in series and/or in parallel. For example, a plurality of CES devices may be coupled to node 663 either in series and/or in parallel to allow for the programming of multiple levels of impedance, and to therefore allow for greater adjustability of $V_{ref}$ 651, in an embodiment. Also, in an embodiment, respective variable impeder devices of a plurality of variable impeder devices may be individually programmable.

Table 1, below, depicts a truth table for various signals of example circuit 600, in an embodiment.

TABLE 1

Truth Table for Example Circuit 600

| | EN 607 | WR# 604 | Set# 602 | Reset# 603 | CES 100 | $V_{ref}$ 651 |
|---|---|---|---|---|---|---|
| Write Mode | 0 | 0 | 0 | 1 | lower impedance state | Invalid |
| | 0 | 0 | 1 | 0 | higher impedance state | Invalid |
| Read Mode | 1 | 1 | 1 | 1 | Programmed State | Valid |

In the preceding description, various aspects of claimed subject matter have been described. For purposes of explanation, specifics, such as amounts, systems and/or configurations, as examples, were set forth. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all modifications and/or changes as fall within claimed subject matter.

What is claimed is:

1. A method, comprising:
    programming an arrangement of individually-programmable correlated electron switch devices to a particular impedance level of a plurality of impedance levels at least in part by applying a first voltage to at least a first correlated electron switch device of the arrangement of correlated electron switch devices to place the at least the first correlated electron switch device in a first impedance state of a plurality of impedance states, wherein the arrangement of correlated electron switch devices to include a plurality of series-coupled correlated electron switch devices and at least one correlated electron switch device coupled in parallel with the series-coupled correlated electron switch devices;
    impeding an adjustable output current from flowing through the arrangement of correlated electron switch devices during the programming the arrangement of correlated electron switch devices; and
    generating a voltage reference signal at least in part by:
        conducting the adjustable output current through the arrangement of correlated electron switch devices; and
        restricting a voltage across the arrangement of correlated electron switch devices to a particular level during the generating the voltage reference signal to prevent a change in impedance level in the arrangement of correlated electron switch devices.

2. The method of claim 1, wherein the applying the first voltage to the at least the first correlated electron switch device to place the at least the first correlated electron switch device in the first impedance state includes controlling a current through the at least the first correlated electron switch device at least in part to establish a particular current density condition in the at least the first correlated electron switch device for a subsequent operation to place the at least the first correlated electron switch device in a second impedance state of the plurality of impedance states, wherein the first impedance state comprises a relatively lower resistance and a relatively lower capacitance state, and wherein the second impedance state comprises a relatively higher resistance and a relatively higher capacitance state.

3. The method of claim 1, wherein the generating the voltage reference signal comprises generating the adjustable output current based at least in part on a reference current, and wherein the method further comprises adjusting the voltage reference signal at least in part by adjusting the reference current.

4. The method of claim 3, wherein a voltage level of the voltage reference signal is substantially equal to a voltage formed across the arrangement of correlated electron switch devices due at least in part to the adjustable output current flowing, at least in part, through the arrangement of correlated electron switch devices.

5. The method of claim 1, further comprising pulsing a select signal to temporarily enable a conductive element to program the arrangement of correlated electron switch devices to an initial state.

6. The method of claim 3, wherein the adjusting the voltage reference signal at least in part by adjusting the reference current further comprises placing the at least the first correlated electron switch device in a second impedance state of the plurality of impedance states and affecting a transition of at least a second correlated electron switch device of the arrangement of correlated electron switch devises from the second impedance state to the first impedance state.

7. The method of claim 3, wherein the adjusting the voltage reference signal comprises adjusting the reference current and placing the at least the first correlated electron switch device in a second impedance state to compensate, at least in part, for process variation.

8. The method of claim 2, further comprising adjusting the voltage reference signal, including performing the subsequent operation to place the at least the first correlated electron switch device in the second impedance state of the plurality of impedance states at least in part by controlling the current through the at least the first correlated electron switch device to at least meet the established particular current density condition in the at least the first correlated electron switch device, including applying a second voltage to the at least the first correlated electron switch device.

9. The method of claim 8, wherein the applying the second voltage to the at least the first correlated electron switch device comprises coupling a supply voltage to the at least the first correlated electron switch device at least in part by affecting a state of a first conductive element through assertion of a first particular signal and at least in part by affecting a state of a second conductive element through assertion of a second particular signal.

10. The method of claim 8, wherein the applying the second voltage to the at least the first correlated electron switch device comprises coupling a supply voltage through a thick oxide transistor to the at least the first correlated electron switch device at least in part by affecting a state of a first conductive element through assertion of a write enable signal and at least in part by affecting a state of a second conductive element through assertion of a reset signal.

11. An apparatus, comprising:
an arrangement of individually-programmable correlated electron switch devices to include a plurality of series-coupled correlated electron switch devices and at least one correlated electron switch device coupled in parallel with the series-coupled correlated electron switch devices;
a circuit to perform an operation to place at least a first correlated electron switch device of the arrangement of correlated electron switch devices in a first impedance state of a plurality of impedance states at least in part to program the arrangement of correlated electron switch devices to a particular impedance level of a plurality of impedance levels;
a circuit to impede an adjustable output current from flowing through the arrangement of correlated electron switch devices during the operation to place the at least the first correlated electron switch device in the first impedance state;
an electrical current generation circuit to include a current mirror circuit to provide the adjustable output current at least in part to the arrangement of correlated electron switch devices to generate a voltage reference signal, wherein a voltage level of the voltage reference signal to be based, at least in part, on the particular impedance level of the arrangement of correlated electron switch devices; and
a circuit to restrict a voltage across the arrangement of correlated electron switch devices to a particular level during voltage reference signal generation to prevent a change in impedance level in the arrangement of correlated electron switch devices.

12. The apparatus of claim 11, further comprising a reference current generation circuit to generate a reference current signal, wherein to provide the adjustable output current to the arrangement of correlated electron switch devices, the electrical current generation circuit to combine the reference current signal with a temperature compensation signal to generate the adjustable output current.

13. The apparatus of claim 12, further comprising a temperature compensation circuit to adjust a current level of the temperature compensation signal to compensate, at least in part, for temperature variation.

14. The apparatus of claim 12, wherein to adjust the voltage level of the voltage reference signal, the reference current generation circuit to adjust a current level of the reference current signal.

15. The apparatus of claim 14, wherein the reference current generation circuit to comprise a programmable current source.

16. The apparatus of claim 15, wherein the programmable current source to comprise a digital-to-analog current converter to generate the reference current signal at least in part in accordance with a specified digital code.

17. The apparatus of claim 14, wherein to adjust the voltage level of the voltage reference signal, the reference current generation circuit to adjust the reference current signal to compensate, at least in part, for process variation.

18. The apparatus of claim 17, further comprising a circuit to control a current through the at least the first correlated electron switch device, wherein to place the at least the first correlated electron switch device in the first impedance state, the circuit to control the current through the at least the first correlated electron switch device at least in part to establish a particular current density condition in the at least the first correlated electron switch device for a subsequent operation to place the at least the first correlated electron switch device in a second impedance state of the plurality of impedance states, the circuit to control the current through the at least the first correlated electron switch device further to perform the subsequent operation to place the at least the first correlated electron switch device in the second impedance state, wherein the current through the at least the first correlated electron switch device to be controlled, at least in part, to at least meet the established particular current density condition in the at least the first correlated electron switch device.

19. An apparatus, comprising:
an arrangement of individually-programmable correlated electron switch devices to include a plurality of series-coupled correlated electron switch devices and at least one correlated electron switch device coupled in parallel with the series-coupled correlated electron switch devices;
a write circuit to perform an operation to place at least one first correlated electron switch device of the arrangement of correlated electron switch devices in a first impedance state of a plurality of impedance states to program the arrangement of correlated electron switch devices to a particular impedance level of a plurality of impedance levels at least in part via placement of a first conductive element in a first state, wherein the placement of the first conductive element in the first state to prevent an adjustable output current from being provided to the arrangement of correlated electron switch devices during the operation to place the at least one first correlated electron switch device in the first impedance state, the write circuit further to place a second conductive element in a particular state to prevent at least one second correlated electron switch device of the arrangement of correlated electron switch devices from changing impedance states during the operation to place the at least one first correlated electron switch device in the first impedance state;
an electrical current generation circuit to generate the adjustable output current based at least in part on a temperature compensation signal and to place the first conductive element in a second state responsive to the operation to place the at least one first correlated electron device of the plurality of correlated electron switch devices in the first impedance state at least in part to provide the adjustable output current at least in part to the arrangement of correlated electron switch devices to generate a voltage reference signal based, at least in part, on the respective impedance states of the at least one first correlated electron switch device and the at least one second correlated electron switch device;
a circuit to restrict a voltage across the arrangement of correlated electron switch devices to a particular level during voltage reference signal generation to prevent a change in impedance level in the plurality of correlated electron switch devices;
a reference current generation circuit to generate a reference current signal, wherein to provide the adjustable output current to the arrangement of correlated electron switch devices, the electrical current generation circuit to combine the reference current signal with the temperature compensation signal; and
a temperature compensation circuit to adjust the temperature compensation signal to compensate, at least in part, for temperature variation.

* * * * *